United States Patent [19]

Miller et al.

[11] 4,074,187
[45] Feb. 14, 1978

[54] CABLE TESTER FOR MULTI-PAIR SHIELDED CABLES

[76] Inventors: David H. Miller, 59 Lancaster Road, Arlington Heights, Mass. 02174; Peter M. Mena, 4 Creeper Hill Road, North Grafton, Mass. 01536

[21] Appl. No.: 746,071

[22] Filed: Nov. 30, 1976

[51] Int. Cl.$^2$ ............................................ G01R 31/02
[52] U.S. Cl. ...................................... 324/51; 324/66; 324/73 R
[58] Field of Search ............................. 324/51, 66, 73

[56] References Cited

U.S. PATENT DOCUMENTS

| | | | |
|---|---|---|---|
| 2,964,701 | 12/1960 | Argabright | 324/66 X |
| 3,131,347 | 4/1964 | Brooks et al. | 324/51 |
| 3,217,244 | 11/1965 | Glover | 324/51 |
| 3,375,334 | 3/1968 | Robinson | 324/66 X |
| 3,609,538 | 9/1971 | Schag | 324/66 |
| 3,867,692 | 2/1975 | Esch | 324/66 |
| 3,982,180 | 9/1976 | Vaiden | 324/66 X |
| 3,986,106 | 10/1976 | Shuck et al. | 324/66 X |

FOREIGN PATENT DOCUMENTS

| | | | |
|---|---|---|---|
| 193,003 | 11/1957 | Austria | 324/66 |
| 977,813 | 4/1951 | France | 324/66 |
| 1,142,660 | 1/1963 | Germany | 324/66 |
| 709,737 | 6/1954 | United Kingdom | 324/66 |

*Primary Examiner*—Gerard R. Strecker
*Attorney, Agent, or Firm*—Irving M. Kriegsman

[57] ABSTRACT

Apparatus is described for detecting the presence of a variety of electrical faults in a multi-pair shielded cable from a junction box connected to the cable at one end and to a socket connected to the cable at the other end. The apparatus includes a first module which is adapted to be connected to the appropriate set of terminals of a main junction box connected to one end of the cable and a second module which is adapted to be conneced to the socket at the other end of the cable. To use the apparatus each module is connected to its respective termination. The first module includes a battery, a termination and a plurality of light emitting diodes, resistors and switches arranged to give a visual indication of faults in the form of shorts between two wires in the cable, shorts between one wire in the cable and the grounding shield and continuity between a pair of wires in the cable. The second module includes a termination and a plurality of light emitting diodes connected to the terminals of the termination in a manner so as to give a visual indication of the polarity of a pair of companion wires in the cable and cable identification of the pairs of wires in the cable.

9 Claims, 2 Drawing Figures

CABLE TESTER FOR MULTI-PAIR SHIELDED CABLES

BACKGROUND OF THE INVENTION

This invention relates to cable testers. More particularly, the invention relates to cable testers for multi-pair shielded cables.

A multi-pair shielded cable is a cable made up of a plurality of pairs of insulated wires disposed inside a sleeve of insulating material, the wires of each pair being twisted about each other and each pair of wires being enclosed within a separate grounding shield. Multi-pair shielded cable is used extensively in the communications and computer industries.

For example, in most all computerized cash register systems that are now in use or are being installed for use in department stores, each one of the cash registers is connected to a main junction box by means of a multi-pair shielded cable. Normally, the wires at one end of the cable are directly connected to appropriate terminals on the main junction box whereas the wires at the other end of the cable are connected to appropriate terminals on a socket which is designed to mate with a plug in the cash register. The number of pairs of wires in the cable is dependent on the type of system being used. For most cash register systems, the number of pairs of wires per cable is generally between two and five. For other systems and machines other than cash registers the number of pairs of wires per cable can be even greater than five. In order for the system to operate properly it is essential that the cable must be connected properly at each end. In addition, the cable must contain no electrical defects. Some of the typical faults that may be present either prior to installation or during the course of use are as follows:

1. shorts between one or more wires and the grounding shield;
2. shorts between two wires of a pair;
3. lack of continuity between the two wires of a pair;
4. incorrect pair identification (i.e., the pairs of wires at one end of the cable are connected to a wrong set of terminals); and
5. incorrect polarity of a pair of wires (i.e., the wires of one pair are connected at one end of the cable to its termination in reverse order).

Hitherto, testing for faults (1) through (4) above has been accomplished by using either an ohm-meter, a buzzer or a flash light along with a shunting element. Testing for fault (5) above has been accomplished by using either an ohm-meter, a buzzer or a flash light and shunting element in combination with a diode. In either case the testing procedure using such devices has proven to be very time consuming since the particular device that is used has to be connected separately to each pair of wires in the cable and then to each wire in the cable and the grounding shield. In addition, the procedure is subject to much human error on the part of the person performing the test.

In U.S. Pat. No. 3,944,914 is disclosed an apparatus for performing a variety of electrical tests on a multi-conductor (but not multi-pair shielded) cable, one pair at a time and in U.S. Pat. No. 3,931,574 is disclosed a test module containing light emitting diodes for testing integrated circuit connections. Examples of other test devices pertinent in one way or another to this invention can be found in U.S. Pat. Nos. 3,333,188; 3,600,678; 3,806,803; 3,826,977; 3,831,089; 3,860,868; 3,904,958, and 3,962,630.

As used throughout this specification, the term "termination" means any device having terminals, such as a plug, a socket, a jack, a connector, or a junction to which can be attached a plurality of wires.

SUMMARY OF THE INVENTION

It is an object of this invention to provide a new and improved apparatus for detecting the presence of faults in a multi-pair shielded cable.

It is another object of this invention to provide an apparatus for detecting the presence of any one of a plurality of electrical faults in a multi-pair shielded cable connected at one end to a main junction box or other termination and at the other end to a socket or other termination.

It is still another object of this invention to provide an apparatus for performing a variety of tests in rapid succession to a multi-pair shielded cable.

It is another object of this invention to provide an electrical test apparatus for use with multi-pair shielded cable that is portable, relatively easy to fabricate and reduces to a minimum the likelihood of human error.

It is still another object of this invention to provide an apparatus capable of detecting shorts, continuity, phase and pair identification in a multi-pair shielded cable connected at each end to a termination.

It is another object of this invention to provide an apparatus for determining if a multi-pair shielded cable is connected properly to a main junction box at one end and to multi-terminal socket at the other end.

It is still another object of this invention to provide an apparatus for performing polarity, continuity and shorts testing simultaneously on each of a plurality of pairs of wires of a multi-pair shielded cable connected to a termination at each end.

The foregoing and other objects and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

Apparatus for detecting the presence of faults in a multi-pair shielded cable according to this invention includes a first module which is adapted to be connected to the appropriate set of terminals of a main junction box connected to one end of the cable and a second module which is adapted to be connected to the socket at the other end of the cable. To use the apparatus each module is connected to its respective termination. The first module includes a battery, a termination and a plurality of light emitting diodes, resistors and switches arranged to give a visual indication of faults in the form of shorts between two wires in the cable, shorts between one wire in the cable and the grounding shield and continuity between a pair of wires in the cable. The second module includes a termination and a plurality of light emitting diodes connected to the terminals of the termination in a manner so as to give a visual indication of the polarity of a pair of companion wires in the cable and cable identification of the pairs of wires in the cable.

BRIEF DESCRIPTION OF THE DRAWING

In order that the invention may be more fully understood, it will now be described, by way of example, with reference to the accompanying drawing in which like reference numerals or characters represent like parts.

DESCRIPTION OF THE PREFERRED EMBODIMENT

Figure 1:
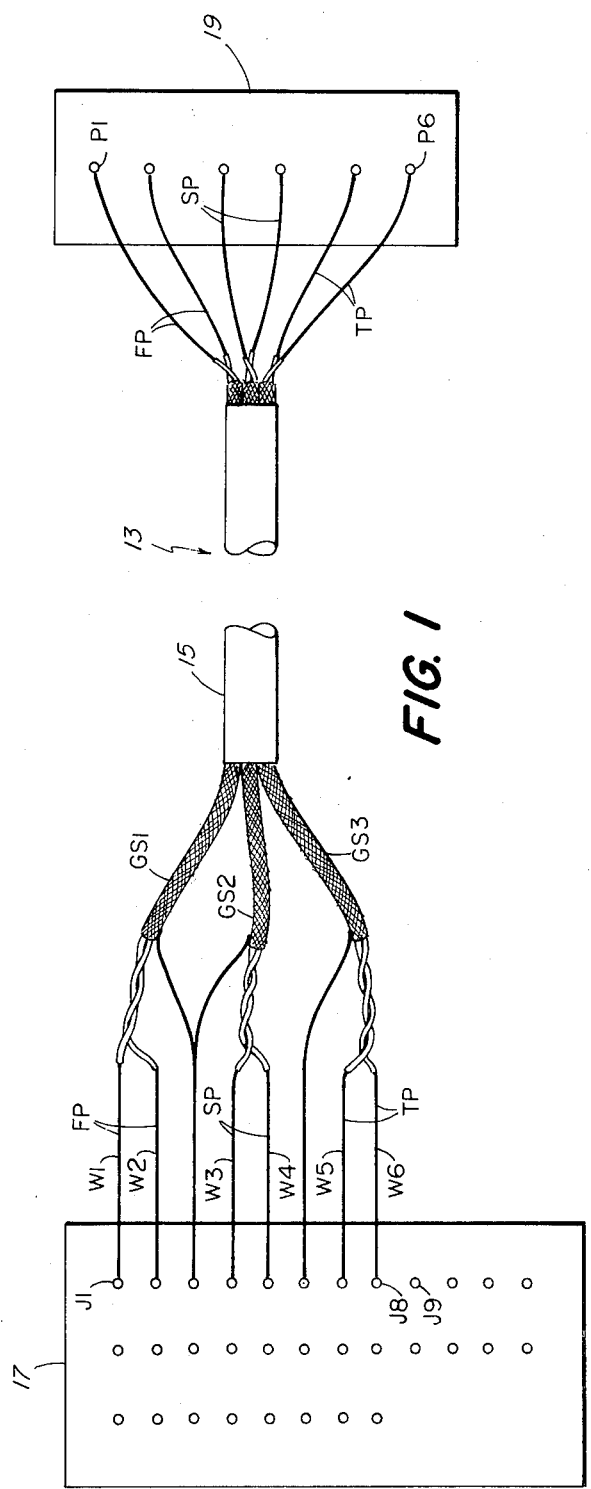
FIG. 1 is a diagrammatic illustration of a multi-pair shielded cable connected at one end to a main junction box and at the other end to a plug.

Referring now to the drawing, there is shown in FIG. 1 a multi-pair shielded cable identified generally by reference numeral 13. The cable 13 includes an outer sleeve 15 of insulative material. Disposed within the sleeve 15 are a first pair FP of wires W1 and W2, a second pair SP of wires W3 and W4 and a third pair TP of wires W5 and W6. Each wire W1 through W6 contains an insulative coating not shown. The two wires in each pair are twisted about each other and enclosed within a separate grounding shield identified as GS1, GS2 and GS3 respectively. The wires and grounding shields are connected at one end of the cable 13 to the terminals J1 through J8 of a junction box 17 in a conventional wiring sequence as follows: wire W1 to terminal J1, wire W2 to terminal J2, shields S1 and S2 to terminal J3, wire W3 to terminal J4, wire W4 to terminal J5, shield S3 to terminal J6, wire W5 to terminal J7 and wire W6 to terminal J8. The wires at the other end of the cable 13 are connected to the terminals (i.e., pins) P1 through P6 of a socket 19 as follows: wire W1 to terminal P1; wire W2 to terminal P2; wire W3 to terminal P3; wire W4 to terminal P4; wire W5 to terminal P5; and wire W6 to terminal P6. Socket 19 may also include terminals (not shown) for the shields S1, S2 and S3.

Figure 2:
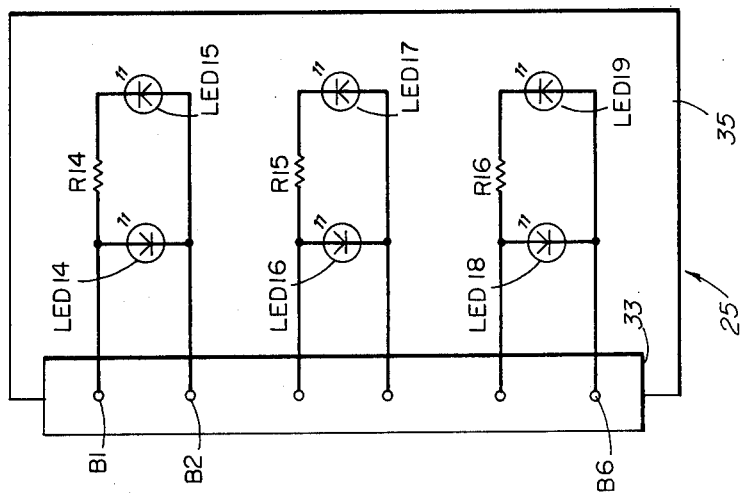
FIG. 2 is a detailed view of an embodiment of an apparatus constructed according to this invention for detecting the presence of faults in the cable shown in FIG. 1 from the junction box to the plug.
Figure 2:
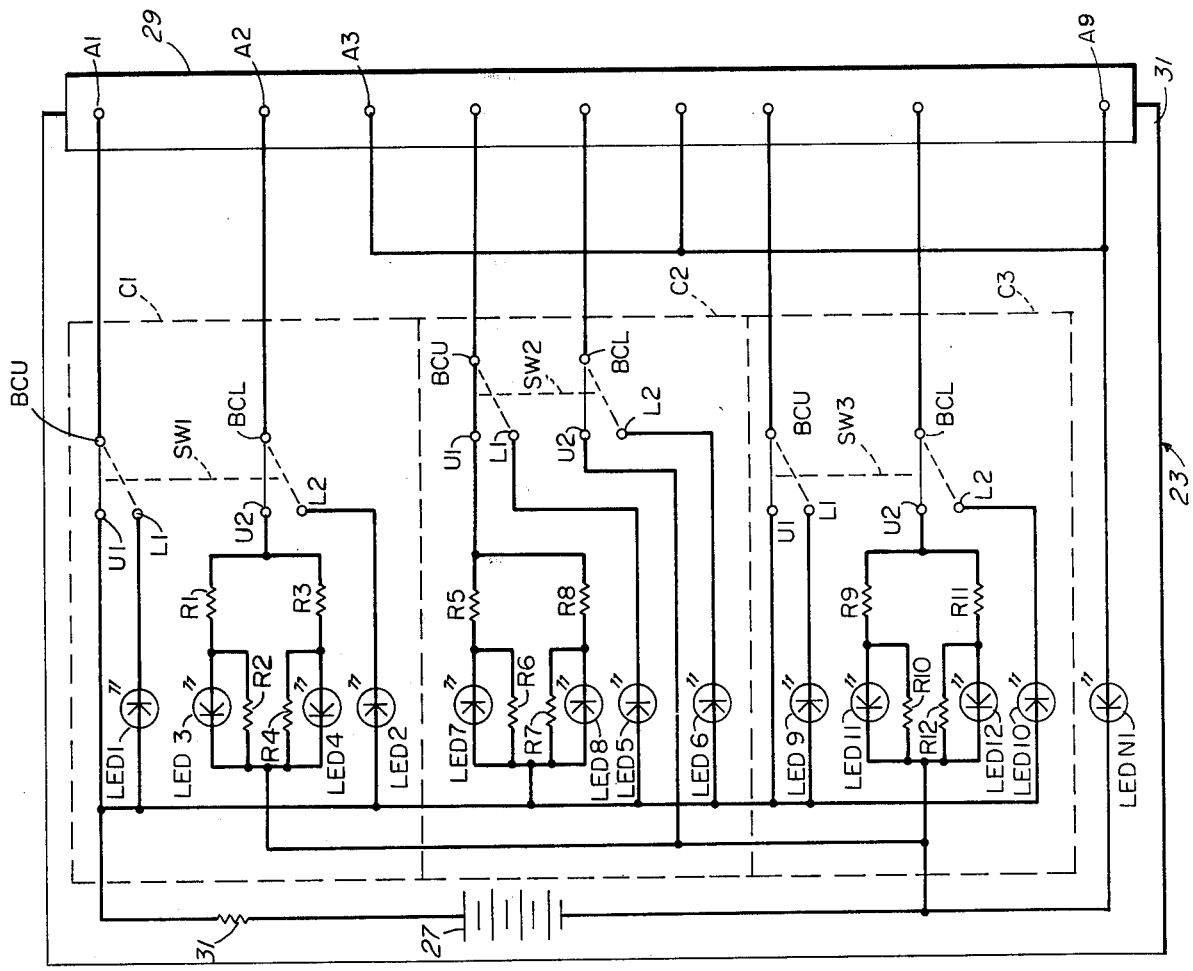

Referring now to FIG. 2 there is shown a testing apparatus constructed according to this invention and identified generally by reference numeral 21. The apparatus 21 includes a first module 23 and a second module 25.

Module 23 includes a battery source 27 comprising four 1.5 volt batteries connected in series, a termination 29 having terminals A1 through A9 and three substantially identical electrical circuits C1, C2 and C3 connected between the battery source 27 and the termination 29. Termination 29 is designed to connect to the terminals of the junction box and may be, for example, a plug or a socket having female pins. The negative terminal of battery source 27 is connected in parallel to terminals A3, A6 and A9 of termination 29 through a red light emitting diode LEDN1 with the cathode of the diode being connected to the negative battery terminal.

Circuit C1 will now be described in detail. As can be seen, the positive terminal of battery source 27 is connected through a 10 ohm resistor 31 to upper position contact U1 of a double-pole double-throw switch SW1, to the anode of first light emitting diode LED1, which is red, and to the anode of second light emitting diode LED2, which is also red. The negative terminal of battery source 27 is connected to the cathodes of third and fourth light emitting diodes LED3 and LED4, LED3 being green and LED4 being red. Diode LED3 has associated therewith an 82 ohm series connected resistor R1 and a 330 ohm parallel connected resistor R2 while diode LED4 has associated therewith a 2700 ohm series connected resistor R3 and an 1800 ohm parallel connected resistor R4. Resistors R1 and R3 are current limiting resistors and also serve to adjust the forward bias of diodes LED3 and LED4 respectively. Resistors R2 and R4 are current by-pass resistors which provide a certain current by-pass at low voltages (non pair shorted) and less of a current by-pass at high voltages. R1 and R3 are connected at the other ends in parallel to upper position contact U2 of switch SW1. The cathode of diode LED1 is connected to lower position contact L1 of switch SW1 and the cathode of diode LED2 is connected to lower position contact L2 of switch SW1. The base contacts BCU and BCL of switch SW1 are connected to terminals A1 and A2 of termination 29 respectively.

Circuit C3 is identical to circuit C1 with diodes LED9 through LED12, resistors R9 through R12 and switch SW3 corresponding to diodes LED1 to LED4, resistors R9 to R12 and switch SW1 respectively. Circuit C2 is also identical to circuit C1 except that the components have been connected to switch SW2 in reverse order, so that, except for resistor 31 there is essentially pure 6 volt voltage between A1 and A5 in termination 29 and also B1 and B4 in termination 33. Consequently, a telephone unit may be connected to these terminals on each module to provide thereby telephone communication from a person at one module to a person at the other module. In order to use the modules for this purpose, switches SW1 and SW2 must be in their upper positions. Module 23 is mounted in a housing 31. Also, it is noted that in addition to giving a visual indication of the presence of a short to shield, light emitting diode LEDN1 in module 23 drops the voltage between battery 27 and light emitting diodes LED1, LED2, LED5, LED6, LED9 and LED10.

Module 25 includes a termination 33 having terminals B1 through B6. Termination 33 may be, for example, a plug having male pins. Terminal B1 is connected to the anode of a first light emitting diode LED14 which is green and through an 82 ohm current limiting resistor R14 to the cathode of a second light emitting diode LED15 which is red. The cathode and anode of these two diodes LED14 and LED15 respectively are connected to terminal B2. Terminals B3 and B4 and terminals B5 and B6 are connected to circuits identical to the circuit connected to terminals B1 with diodes LED16, LED18, corresponding to diode LED14, diode LED17 and LED19 corresponding to LED15 and resistors R15 and R16 corresponding to resistor R14. Module 25 is mounted in a housing 35.

The apparatus 21 is used by connecting module 23 to junction box 17, either directly or through a jumper cable having the necessary mating terminations, so that terminals A1 through A9 of module 23 contact terminals J1 through J9 respectively in junction box 17 and module 25 to socket 19 so that terminals P1 through P6 contact terminals B1 through B6 respectively of module 25.

The following tests can be performed in the following manner:

1. Shorts — grounding shield to a wire. With all three switches SW1 to SW3 in the lower position LP, diode LEDN1 will light if a short exists. If the short is to wire W1 then diode LED1 will also light, if the short is to wire W2 diode LED4 will also light and so forth. Module 25 need not be hooked up for this test.

2. Continuity between pairs of wires — with all three switches SW1 to SW3 in the upper position UP, diodes LED3, LED7 and LED11 will light if there is continuity in pairs of wires W1-W2, W3-W4, and W5-W6 respectively.

3. Shorts — between a pair of wires. With all three switches in the upper position, diodes LED4, LED8 or LED12 will light depending on which pair of wires is shorted. Diodes LED3, LED7 and LED11 will light regardless of whether there is a short.

4. Pair identification — Switches ASW1 to SW3 are switched from the lower position to the upper position in sequence. If there is pair identification, diodes LED14 (or LED15), LED16 (or LED17) and LED18 (or LED19) will light in the same sequence.

5. Polarity — with all three switches SW1 to SW3 in the upper position, diodes LED14 will light if the polarity of pair of wires W1 and W2 is correct, LED15 will light instead of LED14 if the polarit of par of wires W1 and W2 is incorrect and so forth, for other pairs of wires.

It is to be understood that the embodiment of the apparatus described above is intended for use with a three pair type of multi-par shielded cable but that the modules could be enlarged (i.e., circuits added) to accomodate cables having more than three pairs of shielded wires or that components could be added to enable testing for continuity in the grounding shields. Also, the modules could be made smaller (i.e., circuits eliminated from each module) for use with cables having less than three pairs, for a cable having one pair of shielded wires and could be modified according to the principles of this invention to test cables in which each wire is shielded.

The embodiment of the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. Apparatus for testing for shorts, continuity, pair identification and polarity between the terminals of a first termination connected to one end of a multi-pair shielded cable and the terminals of a second termination connected to the other end of the multi-pair shielded cable, wherein the terminals on the first termination are arranged in groups of threes in which the first and second terminals in each group should be connected to the first and second wires respectively of a pair of wires in the cable and the third terminal in each group should be connected to one or more grounding shields in the cable and wherein the terminals in the second termination are arranged in groups of twos in which the first and second terminals in each group should be connected to first and second wires respectively of a pair of wires in the cable and in the same grouping order as in the first termination, said apparatus comprising:

a. a first module, said first module comprising:

1. a DC voltage source having first and second terminals.

2. a termination adapted to be connected to the first termination on the multi-pair shielded cable, said termination having a plurality of groups of terminals, each group comprising a first terminal, a second terminal and a third terminal, each group of terminals being adapted to be connected to a group of terminals on the first termination, with the terminals in each group on each termination being connected in the same order, 3. the third terminal of each group of terminals in the termination in said first module being electrically connected to the second terminal of the voltage source, 4. a plurality of electrical circuits, each electrical circuit being electrically coupled between the DC voltage source and the first and second terminals of one of the groups of terminals in said first module, each electrical circuit comprising first, second, third and fourth light emitting diodes, one end of the first and fourth light emitting diodes being electrically connected to the first terminal of the DC voltage source and one end of the second and third light emitting diodes being electrically connected to the second terminal of the DC voltage source, and switch means arranged in a first position to connect the first terminal in the group of terminals in series to the first terminal in the DC voltage source and the second terminal in the group of terminals in series to each other end of each of the second and third light emitting diodes and in a second position to connect the first terminal in the group of terminals in series to the other end of the first light emitting diode and the second terminal in the group of terminals in series to the other end of the fourth light emitting diode; said first light emitting diode providing a visual indication of a short between the grounding shield and one of the wires when said switching means is in a second position, said third light emitting diode providing a visual indication of continuity between the two wires in a pair of wires when said switching means is in a first position and said fourth light emitting diode providing a visual indication of shorts between the two wires of a pair of wires when said switching means is in an upper position and b. a second module, said second module comprising:

1. a termination adapted to be connected to the second termination on said multi-pair shielded cable, said termination having a plurality of groups of terminals, each group comprising a first terminal and second terminal, each group of terminals being adapted to be connected to a group of terminals on the second termination, with the terminals in each group on each termination being connected in the same order, and 2. a separate electrical circuit connected between the two terminals of each group of terminals on said second module, said separate electrical circuit comprising two light emitting diodes arranged in parallel and reversed for providing a visual indication of the polarity of the two wires in each group when said switch means is in a first position and also for providing a visual indication of pair identification when the switching means is switched from a second position to a first position in a preassigned sequence.

2. The invention according to claim 1 and wherein the switching means comprises a double-pole, double-throw switch.

3. The invention according to claim 2 and wherein the first, second and fourth diodes in each circuit in the first module are red and the third diode is green, the first and second diodes in each circuit in the second module are green and red respectively.

4. The invention according to claim 3 and wherein the DC voltage source comprises a plurality of batteries connected in series.

5. The invention according to claim 4 and wherein the positive end of the DC voltage source is connected to the second diode in each circuit.

6. The invention according to claim 5 and wherein the second and third diodes in each circuit each include a series connected and a parallel connected resistor.

7. The invention according to claim 6 and wherein each module is mounted in a separate housing.

8. The apparatus of claim 7 and further including a fifth light emitting diode connected between the grounding shield terminals on the termination of the first module and the negative end of the DC voltage source, for providing a visual indication of the presence of a short between a grounding shield and at least one wire of said multipair shielded cable.

9. Apparatus for testing for shorts, polarity and continuity in a pair of shielded wires from a first termination connected to a first end of said pair of shielded wires to a second termination connected to said second end of said pair of shielded wires, said first termination having first, second and third terminals which should be connected respectively to the first wire, second wire and grounding shield of said pair of shielded wires, said second termination having first and second terminals which should be connected respectively to the first wire and second wire of said pair of shielded wires, said apparatus comprising: a first module and a second module, the first module comprising a battery having positive and negative terminals, a termination having first second and third terminals, adapted to be connected to first, second and third terminals respectively in said first termination, first and second light emitting diodes each having their anodes connected to the positive terminal of the battery, third and fourth light emitting diodes each having their cathodes connected to the negative terminal of the battery and switch means adapted in a first position to connect the first terminal of the termination to the positive terminal of the battery and the anode of the second and third light emitting diodes to the second terminal of the termination and in a second position to connect the first terminal of the termination to the cathode of the first light emitting diode and the second terminal of the termination to the cathode of the fourth light emitting diode, and means connecting the negative terminal of the battery to the third terminal of the termination, said first light emitting diode providing a visual indication of a short between the grounding shield and one of the wires when the switching means is in said second position, said third light emitting diode providing a visual indication of continuity between the pair of wires when said switching means is in a first position and said fourth light emitting diode providing a visual indication of shorts between the two wires when said switching means is in a first position, the second module comprising a termination having first and second terminals adapted to be connected respectively to first and second terminals in said second termination and a pair of light emitting diodes connected in parallel and reversed across said terminals for providing a visual indication of polarity when said switch means is in a first positon.

* * * * *